United States Patent [19]

Ciskowski

[11] 4,456,676

[45] Jun. 26, 1984

[54] AMINE STABILIZERS FOR WASH-OFF SYSTEMS

[75] Inventor: James M. Ciskowski, Aberdeen, N.J.

[73] Assignee: E. I. Du Pont de Nemours and Company, Wilmington, Del.

[21] Appl. No.: 503,294

[22] Filed: Jun. 10, 1983

[51] Int. Cl.$^3$ ............................ G03F 7/02; G03C 1/06

[52] U.S. Cl. .................................... 430/264; 430/302; 430/309

[58] Field of Search ................ 430/264, 302, 306, 309

[56] References Cited

U.S. PATENT DOCUMENTS

| | | | |
|---|---|---|---|
| 3,293,035 | 12/1966 | Van Hoot | 430/300 |
| 3,295,969 | 1/1967 | Abbott | 430/264 |
| 3,375,114 | 3/1968 | Hayakawa et al. | 430/600 |
| 3,453,111 | 7/1969 | Yackel | 430/262 |
| 3,615,529 | 10/1971 | Tajima et al. | 430/405 |
| 3,856,524 | 12/1974 | Bissonette | 430/936 |
| 4,076,531 | 2/1978 | Crowell | 430/264 |
| 4,233,392 | 11/1980 | Friedel | 430/264 |

OTHER PUBLICATIONS

Tull, "Tanning Development and its Applications to Dye Transfer Images," J. Photo. Sci., vol. 11, 1963, pp. 1–26.

Tull, "Further Studies of the Tanning Developer," J. Photo. Sci., vol. 24, 1976, pp. 158–167.

*Primary Examiner*—Mary F. Downey

[57] ABSTRACT

Amine compounds or metal-ammine complexes incorporated into developer-incorporated wash-off films stabilize against premature gelatin hardening on aging. Preferred additives are two gelatin amino acids, lysine and arginine.

3 Claims, No Drawings

AMINE STABILIZERS FOR WASH-OFF SYSTEMS

BACKGROUND OF THE INVENTION

1. Field of the Invention

The present invention relates to photosensitive materials which are developed by a wash-off procedure. In particular, the present invention provides photosensitive materials with improved aging stability via incorporation therein of an amine compound or metal-ammine complex.

2. State of the Art

Photosensitive wash-off systems which contain gelatin as the binder in a silver halide emulsion layer, and in any auxiliary layers, produce images when gelatin is tanned or hardened in exposed and developed areas, and untanned or unhardened gelatin is washed off in unexposed areas. Prior art references to such tanning development include U.S. Pat. Nos. 2,596,576, 3,364,024, 3,440,049 and 4,233,392; and British Pat. No. 1,294,355. For this purpose it is essential that the gelatin constituent of the raw film be storage-stable, i.e., resistant to aging reactions which would crosslink or otherwise insolubilize the gelatin during storage, presumably by reactions involving amine sites in the polypeptide linkages of the gelatin chain. Several commercial wash-off films approach this problem by incorporating antioxidants into the gelatin to improve aging stability, but these are only partly effective. Hence, stable high speed wash-off films have not been commercially available. A better means for achieving aging stability is needed.

SUMMARY OF THE INVENTION

It has been found that incorporation of amine compounds, amine-containing polymers, or metal-ammine complexes into at least one of the gelatin layers of photosensitive systems will stabilize these against deterioration by hardening on aging. This is particularly useful in silver halide wash-off films comprising a gelatin layer in combination with carbon black.

These amine compound additives, preferably amino acids, are believed to provide amine sites in the gelatin which are comparably reactive to the naturally occurring gelatin amine sites. Hence, they compete with the latter in degradative aging reactions that would otherwise result in insolubilization of the image layer and poor aging performance. Thus, the incorporated amine compound serves as a readily available reaction site for unwanted hardening or tanning action, allowing the gelatin to remain unreacted until exposed and processed. Reacted amino acids, for example, do not insolubilize the binder as reacted gelatin would, and therefore preserve film stability by permitting wash-off. Prior art suggests incorporating aliphatic amines in developer solutions, with hydroquinone, to confine tanning-developed image formation to the exposed areas, but the use of these additives in the film as tanning stabilizers is unknown.

This invention can not only improve stability in high speed wash-off films, including films with incorporated developers such as polyhydroxy-spirobisindane (U.S. Pat. No. 3,440,049) or hydroquinone (Belg. Pat. No. 631,556), but also may complement antioxidant stabilization in wash-off films. Since amino acids are chemically similar to gelatin and can easily be dissolved, this invention also has process advantages, is generally applicable to various emulsions, and is low cost.

The invention can be concisely defined as directed to a photosensitive wash-off film for a tanning development system consisting of a support, an unhardened or only slightly hardened gelatin-containing silver halide emulsion layer and, if desired, an auxiliary layer, on said support, wherein the gelatin constituent tends to become water-insoluble and hardens and binds to the support during storage, characterized in that a stabilizing amount of an amine compound, amine-containing polymer, or metal-ammine complex is incorporated into the silver halide emulsion layer or into an auxiliary layer, to increase the aging time required for the gelatin to harden and bind to the support. The amine compound is preferably an amino acid, lysine or arginine, and is added in an amount of 0.001 to 0.25 g per gram of gelatin. An image is produced on the aforesaid photosensitive wash-off film by imagewise exposing said film, developing the exposed film in an alkali-activating bath having a pH of at least 9, and thereafter washing off the nonhardened areas with warm water.

DETAILED DESCRIPTION OF THE INVENTION

The improvement provided by the present invention is not limited to the use of amino compounds per se; the term "amine compound" or "ammine complex" is meant to include amines, amino acids, and metal-ammine complexes which function in the present invention to lower residual wash-off density upon aging. It is the amine functionality of the amine compound or polymer, or ability to release ammonia in the wash-off film system in the case of the metal-ammine complex, which is believed to provide the stabilizing characteristic of the present invention. Arginine, lysine, salicylamide, amine-containing polymers, e.g., polyethyleneimine, $(CH_2CH_2NH)_n$ with a molecular weight over 50,000, glycine, ethanolamine, diethanolamine, 3,3'-iminobispropylamine, 1,3-diaminopropane, and hexaammine cobalt (III) chloride have all demonstrated improved stability for wash-off systems. It is not known whether the metal-ammine complex is effective per se, or because it releases ammonia to counteract undesired aging reactions.

While gelatin is the preferred binder for wash-off systems which incorporate the amine compound, polymer, or metal-ammine complex of the present invention, other synthetic and natural binders can be employed in combination with gelatin. Also, not all layers of a wash-off system need comprise a gelatin binder; for instance, a top coat over a gelatino-silver halide layer may contain a tanning developer dispersed in polyvinyl alcohol.

The following examples serve to illustrate the present invention, of which Example 1 is the best mode.

EXAMPLE 1

Control and experimental wash-off films were prepared by the following procedure:

A chemical and optically sensitized silver chlorobromide emulsion (30 mole % bromide) was prepared containing 250 g of gelatin per mole of silver halide.

A carbon black dispersion was prepared by blending 100 g furnace black with 10 g polyvinyl pyrrolidone (molecular weight 40,000), 40 g 2-methylpentanediol-2,4, and 40 g polyethylene oxide (molecular weight 1000) in 340 g water using a high speed stirrer (10,000 rpm).

A coating composition was prepared by combining 78 parts by weight of emulsion with 15 parts by weight of carbon black dispersion, 2 parts by weight polyethylacrylate latex, and 0.3 parts by weight polyethylene oxide (molecular weight 1000). This composition without further addition served as a control.

Portions of this composition received the following additions, measured as % by weight of the composition: benzenesulfinic acid, 0.3%; 4-acetylaminophenol, 0.7%; cyclohexanoneoxime, 0.2%. These compositions served as comparison controls.

Further additions of lysine or arginine were made to the control composition and to the comparison composition which contained benzenesulfinic acid, 4-acetylaminophenol or cyclohexanoneoxime, such that the lysine or arginine comprised 0.08% to 0.28% by weight of the total or 4% to 21% by weight of the gelatin. All compositions were coated on a gel-subbed polyethylene terephthalate support without further additions to give a coating weight of 4 g/m$^2$ (1 g Ag/m$^2$).

All of the coatings were overcoated with an aqueous dispersion of a composition of 0.26 g 3,3,3',3'-tetramethyl-5,6,5',6'-tetrahydroxy spiro-bis-indane, 1.47 g polyvinylalcohol binder, 0.13 g polyvinyl pyrrolidone binder, 0.12 g alkylaryl sulfonate surfactant, and 0.07 g polyoxyethylene (4) lauryl ether to provide a coating weight of 2.1 g/m$^2$.

Samples of the films were exposed in a commercial EGG sensitometer and activated for 15 seconds at 40.5 $\pm$1° C. in a solution of the following composition:

| | |
|---|---|
| Potassium carbonate (anhydrous) | 100 g |
| Ethylenediaminetetraacetic acid | 1.0 g |
| Water up to | 1000 ml |
| (pH was adjusted to 11.5 with acetic acid) | |

The samples were then washed at 20°-25° C. and at pH 5 in a fixing solution, viz. an aqueous solution of the following:

| | |
|---|---|
| Ammonium thiosulfate | 128 g/l |
| Sodium acetate | 32 g/l |
| Ammonium thiocyanate | 77 g/l |
| Sodium bisulfite | 13 g/l |
| Acetic acid | 16.7 g/l |

Then the films were washed off for about 15 seconds by spraying with warm water under pressure.

These tests were run when the film was fresh and continued as the films aged for a period of three months.

The films containing arginine or lysine either with or without the addition of cyclohexanoneoxime showed lower background density in the washed out areas. The films containing 0.28% arginine or lysine were superior to those containing 0.08% arginine or lysine in exhibiting lower background density on aging. The films containing the 0.28% level of arginine or lysine showed a somewhat lower development rate, which could be attributed to the higher binder content and hardening capacity of these films relative to the controls.

This example illustrates the improvement in image clarity on normal aging which was achieved by incorporating an amino acid in a gelatino-silver halide layer.

EXAMPLE 2

Experiments were repeated as in Example 1 except that arginine and lysine were not added to the gelatino-silver halide layer but instead were incorporated in a gelatin underlayer of 0.44 g/m$^2$.

Upon aging it was found that lower background density was observed in the washed out areas when arginine or lysine were incorporated in the gelatin underlayer than for the controls comprising gelatin only.

This example illustrates that the improvement in image clarity on normal aging can be obtained by incorporating an amino acid in an auxiliary layer of a wash-off film.

EXAMPLE 3

A series of coatings of carbon black in gelatin were made to compare other amine compounds listed above, and hexaammine cobalt (III) chloride to the amino acids previously tested, i.e., arginine and lysine. These were tested at one week and at 3 months aging at 20°-25° C. to determine the residual density which remained after the wash-off step and which could be attributed to undesired premature hardening or tanning of the gelatin, which was dispersed with carbon black. All compounds tested were effective in avoiding undesirable background density on aging.

This demonstrated that functional amines or metal-ammine complexes serve to retard density buildup in gelatin layers on aging.

We claim:

1. A process of producing an image on a photosensitive wash-off film by tanning development, which process consists essentially of imagewise exposing said film, developing the exposed film in an alkali-activating bath having a pH of at least 9, and thereafter washing off the nonhardened areas with warm water, said photosensitive wash-off film consisting of a support, an unhardened or only slightly hardened gelatin-containing silver halide emulsion layer and an auxiliary layer on said support, and wherein the gelatin constituent tends to become water-insoluble and to bind to the support during storage, characterized in that a stabilizing amount of an amino acid or amine-containing polymer is incorporated into the silver halide emulsion layer or into an auxiliary layer.

2. The process of claim 1 wherein the amino acid is arginine or lysine.

3. The process of claim 1 wherein the amino acid or amine-containing polymer is added in the amount of from 4 to 21% by weight of the gelatin.

* * * * *